(12) United States Patent  
Manabe (10) Patent No.: US 6,803,287 B2  
(45) Date of Patent: Oct. 12, 2004

(54) METHOD FOR FORMING A SEMICONDUCTOR DEVICE HAVING CONTACT WIRES OF DIFFERENT SECTIONAL AREAS

(75) Inventor: Kazutaka Manabe, Tokyo (JP)

(73) Assignee: NEC Corporation, Tokyo (JP)

( * ) Notice: Subject to any disclaimer, the term of this patent is extended or adjusted under 35 U.S.C. 154(b) by 150 days.

(21) Appl. No.: 10/424,068

(22) Filed: Apr. 28, 2003

(65) Prior Publication Data

US 2003/0197274 A1 Oct. 23, 2003

Related U.S. Application Data

(63) Continuation of application No. 09/664,725, filed on Sep. 19, 2000.

(30) Foreign Application Priority Data

Sep. 24, 1999 (JP) .............................................. 11-270463

(51) Int. Cl.[7] .............................................. H01L 21/336
(52) U.S. Cl. ........................ 438/301; 438/306; 438/307; 438/558
(58) Field of Search ................................. 438/230, 231, 438/232, 233, 301, 305, 306, 307, 523, 533, 558, 571, 586, 597; 257/334, 344, 382, 408

(56) References Cited

U.S. PATENT DOCUMENTS

| | | | |
|---|---|---|---|
| 3,915,767 A | 10/1975 | Welliver | 438/346 |
| 4,721,686 A | 1/1988 | Contiero et al. | 438/199 |
| 5,156,989 A | 10/1992 | Williams et al. | 438/206 |
| 5,406,104 A | 4/1995 | Hirota et al. | 257/351 |
| 5,409,843 A | 4/1995 | Yamauchi et al. | 438/202 |
| 5,473,184 A * | 12/1995 | Murai | 257/382 |
| 5,770,880 A * | 6/1998 | Woodbury et al. | 257/336 |
| 5,940,708 A * | 8/1999 | Aoyama et al. | 438/275 |
| 5,940,710 A * | 8/1999 | Chung et al. | 438/305 |
| 6,127,214 A * | 10/2000 | Niuya | 438/224 |

FOREIGN PATENT DOCUMENTS

| | | |
|---|---|---|
| JP | 60-776 | 1/1985 |
| JP | 63-237551 | 10/1988 |
| JP | 4-116924 | 4/1992 |
| JP | 6-326119 | 11/1994 |
| JP | 08-18052 | 1/1996 |
| JP | 08-264561 | 10/1996 |
| JP | 2763025 | 3/1998 |
| JP | 11-195787 | 7/1999 |

* cited by examiner

Primary Examiner—Wael Fahmy  
Assistant Examiner—Hoai Pham  
(74) Attorney, Agent, or Firm—Young & Thompson (57) ABSTRACT

In a semiconductor device (10), plural diffusion layer areas (2, 3) are formed so that the impurity concentration of the diffusion layer area (2) is set to be higher than that of the diffusion layer area (3), and a first contact wire (4) connected to the diffusion layer area (2) having the higher impurity concentration is set to be larger in sectional area than a second contact wire (5) connected to the diffusion layer area (3) having the lower impurity concentration.

9 Claims, 5 Drawing Sheets

METHOD FOR FORMING A SEMICONDUCTOR DEVICE HAVING CONTACT WIRES OF DIFFERENT SECTIONAL AREAS

This is a CON of application Ser. No. 09/664,725 filed Sep. 19, 2000.

BACKGROUND OF THE INVENTION

1. Field of the Invention

The present invention relates to a semiconductor device and a method of manufacturing the semiconductor device, and more particularly to a semiconductor device which has a contact wire in connection with the construction of a diffusion layer area, and a method of manufacturing the same which can form the contact wire in connection with the construction of the diffusion layer area without requiring any additional lithographic process.

2. Description of the Related Art

There has been hitherto known so-called asymmetric type transistor in which the impurity concentration of a diffusion layer area is varied between a source area and a drain area in order to enhance the characteristics of the transistor, for example.

FIGS. 3A to 3D show the construction of a conventional asymmetric transistor and a method of manufacturing the same.

Figure 3A:
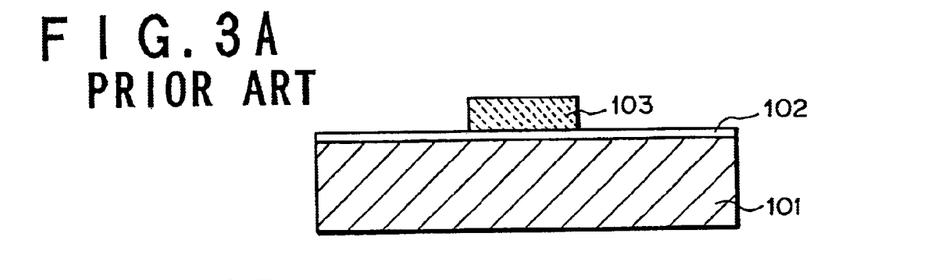
FIGS. 3A, 3B, 3C, and 3D show successive steps in a conventional semiconductor device manufacturing method.

According to the manufacturing method, as shown in FIG. 3A, a silicon oxide film 102 of 100 Å is formed on the surface of a p-type silicon substrate 101, and then a poly-crystal silicon film doped with phosphor is formed at a thickness of 1500 Å, for example. Thereafter, the polycrystal silicon film thus formed is subjected to a patterning treatment to obtain a desired pattern, and it is used as a gate electrode 103.

Figure 3B:
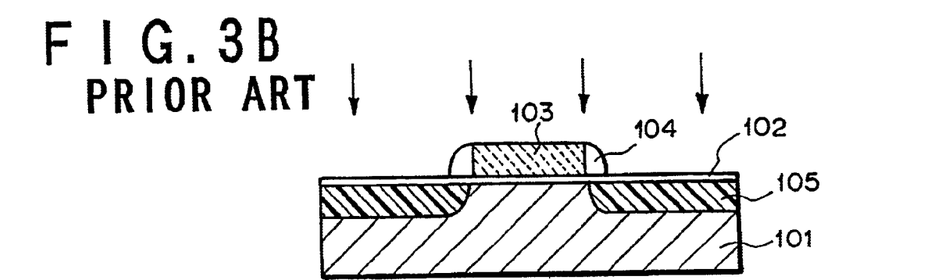

Thereafter, for example, a silicon oxide film of 1500 Å is formed and subjected to an anisotropic etch-back treatment to form a side wall 104 on the side surface of the gate electrode 103. Here, n-type impurities (for example, As) are doped by ion implantation to form a diffusion layer 105 as shown in FIG. 3B.

Figure 3C:
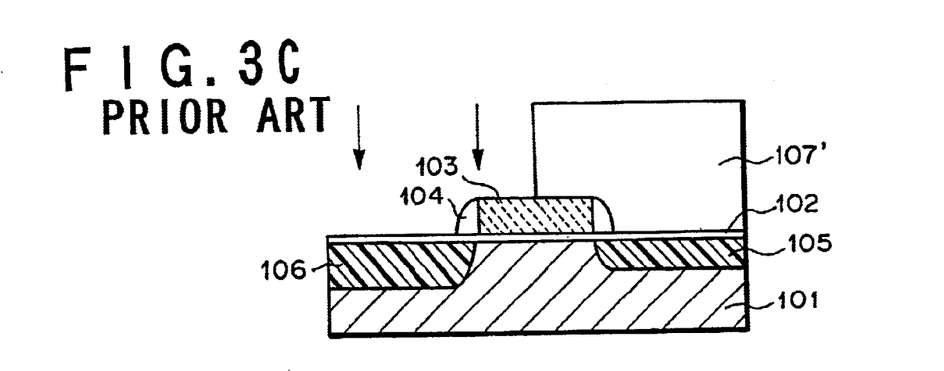

Further, as shown in FIG. 3C, n-type impurities (for example, As) are additionally doped into only one of the source and the drain by the ion implantation using a lithographic technique to form a diffusion layer 106 having a larger concentration. Reference numeral 107' denotes a patterned photoresist film. Thereafter, formation of an insulating film 107, formation of a contact wire 108 and then formation of a wire 109 are carried out in this order, thereby completing a semiconductor transistor as shown in FIG. 3D.

Figure 3D:
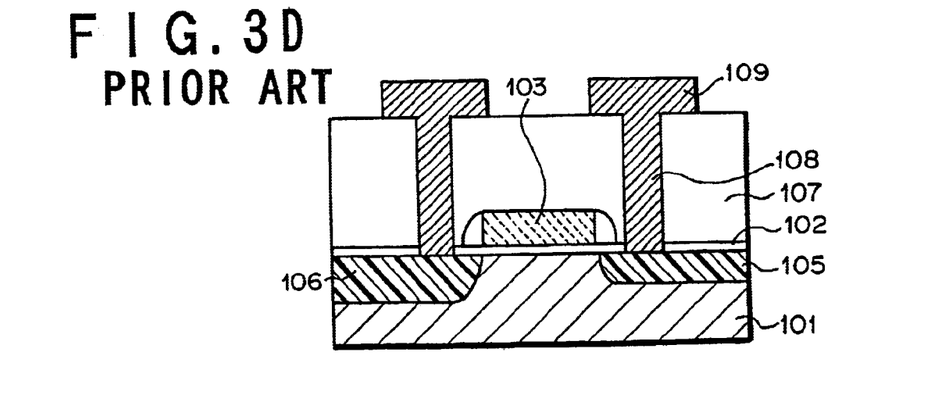

As shown in FIG. 3D, the structure of the conventional transistor thus formed is designed so that the concentration of the impurities is different between the source and the drain and the contact wires to be connected to the wires provided to the source and the drain are designed to have the same size at both the source side and the drain side.

Accordingly, even when a semiconductor device is designed so that the impurity concentration of a diffusion layer is different from that of another diffusion layer, this design does not greatly contribute to the improvement of the electrical characteristics of the semiconductor device as long as the contact wires to be connected to these diffusion layers are equal in size, thickness or the like.

For example, it is considered that the voltage between the source and the gate of a transistor is prevented from being reduced by setting the impurity concentration of the source area to be larger than that of the drain area. In order to satisfy this structure, it is necessary to reduce the resistance of a contact wire to be connected to the source diffusion layer concerned, and thus it is also necessary to increase the sectional area of the contact wire concerned.

Further, in order to form diffusion layers which are different in impurity concentration, a further lithographic step is required to be added, and thus the number of manufacturing steps is increased, resulting in rise-up of the cost.

Besides, each of JP-60-776(A) and JP-8-18052(A) discloses a method of manufacturing a semiconductor device in which the impurity concentration is set to be asymmetrical between a source diffusion layer area and a drain diffusion layer area, and JP-8-264561(A) discloses a transistor in which P-type impurities and N-type impurities are doped in each of the source and drain diffusion layer areas and which is designed in an asymmetrical structure. However, these prior art publications never disclose a technique of designing a semiconductor device so that the impurity concentration is set to be asymmetrical between both the diffusion layers and also the contact wires to be connected to both the diffusion layers are asymmetrical in sectional area.

Further, JP-11-195787(A) discloses a transistor in which the source diffusion layer area and the drain diffusion layer area are designed to be structurally asymmetrical with respect to the gate electrode, and the shape of the contact wire to be connected to one diffusion layer area is set to be different from that of the contact wire to be connected to the other diffusion layer area. However, it never disclose a technique of designing a transistor that the impurity concentration is set to be asymmetrical between both the diffusion layers and also the contact wires to be connected to both the diffusion layers are set to be asymmetrical in sectional area.

Still further, JP-2,763,025 corresponding to JP-9-283536 (A) discloses a transistor in which the source diffusion layer area and the drain diffusion layer area are designed to be structurally asymmetrical with respect to the gate electrode. However, it never disclose a technique of designing a transistor so that the impurity concentration is set to be asymmetrical between both the diffusion layers and also the contact wires to be connected to both the diffusion layers are set to be asymmetrical in sectional area.

SUMMARY OF THE INVENTION

Therefore, the present invention has been implemented to solve the above problems of the prior arts, and has an object to provide a semiconductor device and a semiconductor device manufacturing method which do not need any additional lithographic step and can suppress increase of the manufacturing cost in a process of forming a semiconductor device designed so that the impurity concentration of some of plural diffusion layer areas provided on a semiconductor substrate is set to be different from that of the other diffusion layer areas, or a semiconductor device designed so that the electrical conduction type of some of plural diffusion layer areas provided on a semiconductor substrate is set to be different from that of the other diffusion layer areas.

In order to attain the above object, according to a first aspect of the present invention, there is provided a semiconductor device in which the impurity concentration of at least one of plural diffusion layer areas formed in the semiconductor device is set to be higher than that of the other of diffusion layer areas, and a first contact wire connected to the at least one of diffusion layer areas having the higher impurity concentration is set to be larger in sectional area than a second contact wire connected to the other of diffusion layer areas having the lower impurity concentration.

According to a second aspect of the present invention, there is provided a method of manufacturing a semiconductor device which comprises the steps of: doping first impurities having a first conduction type into plural predetermined positions in the neighborhood of the surface of a semiconductor substrate or a semiconductor layer to form plural second diffusion layer areas; forming contact wires on the second diffusion layer areas so that a contact wire formed in at least one of the second diffusion layer areas is set to be larger in sectional area than a contact wire formed in the other of the second diffusion layer areas; forming a space portion in the contact wire having the larger sectional area; and further doping first impurities having the same conduction type as the first conduction type into the at least one of the second diffusion layer areas through the space portion with the peripheral edge portion of the contact wire being used as a mask to form a first diffusion layer area having an impurity concentration higher than the impurity concentration of the other of the second diffusion layer areas.

Further, according to a third aspect of the present invention, there is provided a method of manufacturing a semiconductor device which comprises the steps of: doping first impurities having a first conduction type into plural predetermined positions in the neighborhood of the surface of a semiconductor substrate or a semiconductor layer to form plural second diffusion layer areas; forming contact wires on the second diffusion layer areas so that a contact wire formed in at least one of the second diffusion layer areas is set to be larger in sectional area than a contact wire formed in the other of the second diffusion layer areas; forming a space portion in the contact wire having the larger sectional area; and doping second impurities having a second conduction type different from the first conduction type of the first impurities into the at least one of the second diffusion layer areas through the space portion with the peripheral edge portion of the contact wire being used as a mask so that the concentration of the second impurities is higher than that of the first impurities in the at least one of the second diffusion layer areas, whereby the conductive characteristic of the at least one of the second diffusion layer areas is renovated to form a first diffusion layer area having the second conduction type.

According to the semiconductor device and the semiconductor device manufacturing method according to the present invention, at least one diffusion layer and the other diffusion layer are designed to be different in impurity concentration, and the contact wires connected to the diffusion layers are set to be different in sectional area. Therefore, by utilizing the difference in coverage between the contact wires for the respective diffusion layers, the impurities are further doped into the at least one diffusion layer by ion implantation with the contact wire being used as a mask, and accordingly a semiconductor device comprising asymmetrical diffusion layers and asymmetrical contact wires can be manufactured without needing any additional lithographic process.

Further, specifically, in the present invention, there can be easily manufactured a transistor in which the source and the drain are asymmetrical in concentration, and the contacts connected to the wires provided for the source and the drain are different in size between the source side and the drain side.

DETAILED DESCRIPTION OF THE PREFERRED EMBODIMENTS

Preferred embodiments according to the present invention will be described hereunder with reference to the accompanying drawings.

Figure 1A:
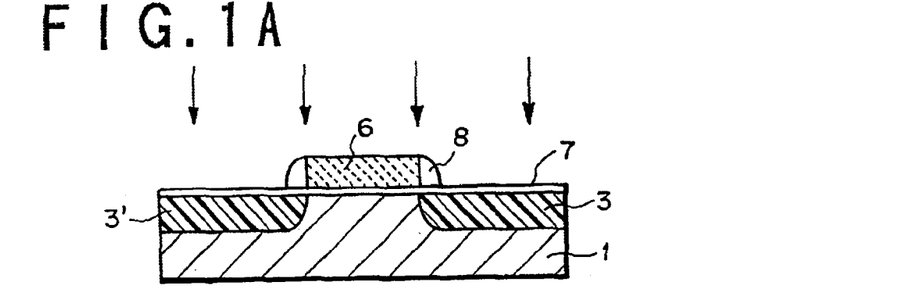
FIGS. 1A, 1B, 1C, and 1D show successive steps in a manufacturing process in a semiconductor device manufacturing method according to the present invention.
Figure 1B:
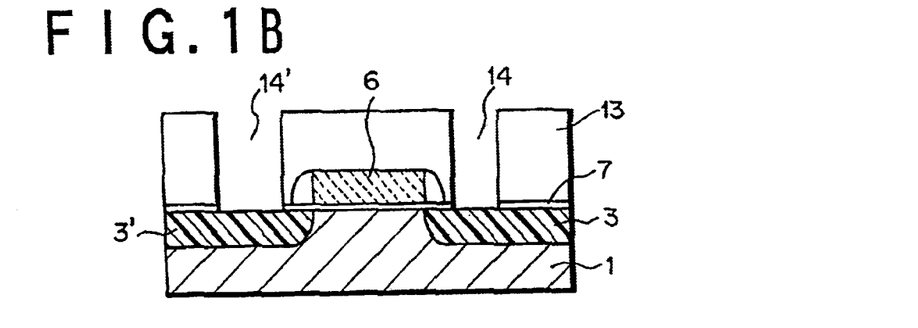
Figure 1C:
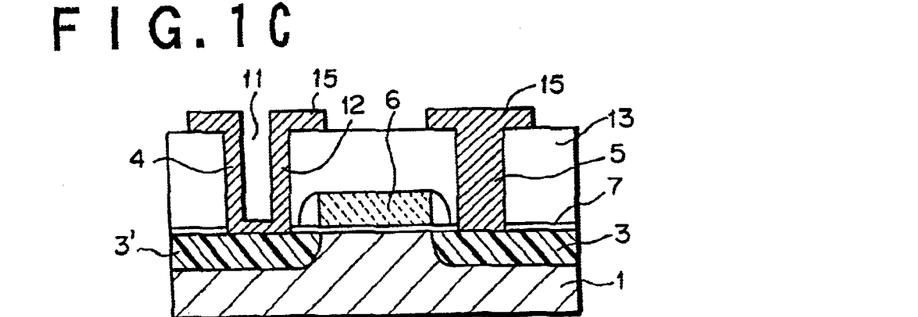
Figure 1D:
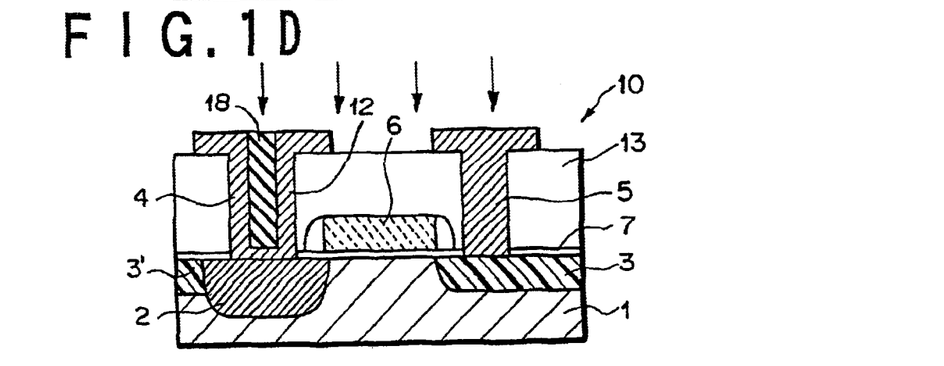
Figure 2:
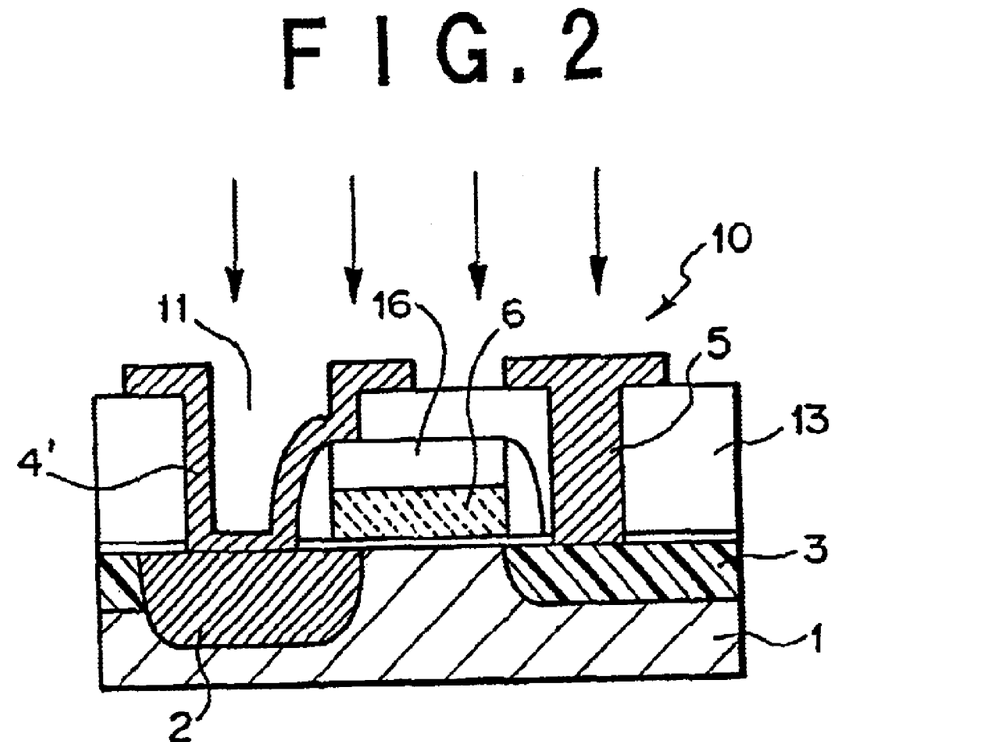
FIG. 2 is a cross-sectional view showing the construction of a semiconductor device according to the present invention.

FIGS. 1A to 1D are cross-sectional views showing a process of a main part of a semiconductor device manufacturing method according to the present invention, and particularly FIG. 1D is a cross-sectional view showing the construction of a semiconductor device formed by the method of the present invention.

That is, FIG. 1D show a semiconductor device 10 in which the impurity concentration of at least one diffusion layer area 2 of plural diffusion layer areas 2, 3 formed in a semiconductor device is set to be higher than that of the other diffusion layer area 3, and also the sectional area of a first contact wire 4 connected to the diffusion layer area 2 having the higher impurity concentration is set to be larger than that of a second contact wire 5 connected to the diffusion layer area 3 having the lower impurity concentration.

In the semiconductor device 10 of the present invention, the diffusion layer area 2 having the higher impurity concentration is preferably formed as follows. A diffusion layer area 3' is formed by doping impurities having a predetermined electrically conductive property, and then the same impurities having the predetermined electrically conductive property are further doped into a part or the whole of the diffusion layer area 3' thus formed.

That is, according to the present invention, as shown in FIG. 1A, for example, N-type impurities are doped into a semiconductor substrate 1 through a gate insulating film 7 by using a gate electrode 6 formed on the semiconductor substrate 1 and a side wall 8 formed on the side surface of the gate electrode 6 as masks, thereby forming N-type diffusion layer areas 3, 3'.

The N-type diffusion layer areas 3, 3' shown in FIG. 1A are referred to as "existing diffusion layer areas". N-type impurities (for example, As) are doped into one existing diffusion layer area 3' (a part of the existing diffusion layer areas) to form a diffusion layer area 2 having an impurity concentration higher than that of the N-type impurities in the other existing diffusion layer area 3. The diffusion layer area 2 is referred to as "first diffusion layer area", and the existing diffusion layer area 3 is referred to as "second diffusion layer area".

Further, in the semiconductor device 10 of the present invention, it is preferable that the first contact wire 4 connected to the first diffusion layer area 2 having the higher N-type impurity concentration is provided with a space portion 11 which is formed along the longitudinal axial direction of the first contact wire 4.

The sectional area taken in the direction perpendicular to the longitudinal axial direction of the space portion 11 is not limited to a specific value, and it is preferably determined in consideration of the size of the first diffusion layer area to be formed, or the implantation energy of the impurities or the like.

As described later, the space portion 11 constitutes a doping portion for the ion implantation of the impurities when the first diffusion layer area 2 having the higher impurity concentration is formed, and the layer 12 formed of a conductive member which is disposed around the space portion 11 functions as a mask for the ion implantation of the impurities. Accordingly, the first diffusion layer area 2 having the higher impurity concentration is formed in self-alignment with the first contact wire 4 by doping the impurities through the space portion 11 provided to the first contact wire 4.

In the present invention, the space portion 11 in the first contact wire 4 may be embedded with the same or different conductive member.

The first contact wire 4 is preferably formed of the same conductive material as the second contact wire 5 connected to the second diffusion layer area 3, and it is formed in the same step as the formation of the second contact wire 5.

The term "sectional area of the contact wire connected to the diffusion layer area" used in the present invention means the sectional area of a portion of the contact wire which is brought into contact with the diffusion layer area. The sectional area is taken perpendicularly to the current flow direction in the contact wire portion.

The formation of the space portion 11 in the first contact wire 4 according to the present invention is carried out as follows. For example, as shown in FIG. 1B, an interlayer insulating film 13 is coated on the surface of the semiconductor substrate on which the transistor structure shown in FIG. 1A is formed, and then opening portions 14, 14' for contact wires are formed so that the opening portion 14' formed at the portion of the interlayer insulating film 13 corresponding to the existing diffusion layer area 3' in which the first diffusion layer area 2 will be formed is set to be larger in size than the opening portion 14 formed at the portion of the interlayer insulating film 13 corresponding to the second diffusion layer area 3, and then a layer 15 of conductive member is deposited on the interlayer insulating film by the deposition or sputtering method and subjected to a predetermined patterning treatment to form the contact wires 4 and 5.

In this case, the deposition is preferably carried out under such a condition that the opening portion 11 is formed while the opening portion 14' is prevented from being fully embedded with the layer of conductive member 12 because the opening portion 14' is formed to have a larger size.

Further, in another embodiment of the semiconductor device 10 of the present invention, at least one of the space portion 11 and the first contact wire 4 is preferably formed so that the sectional area thereof is increased along the axial direction of the space portion 11 or the first contact wire 4 as it is far away from the contact portion with the diffusion layer area 2 having the higher impurity concentration.

In this embodiment, an insulating layer 16 is preferably inserted between the gate electrode 6 and the interlayer insulating film 13.

More specifically, according to the embodiment of the semiconductor device 10 according to the present invention, the transistor is composed of the first diffusion layer area 2 having the higher impurity concentration and the second diffusion layer area 3 having the lower impurity concentration as shown in FIG. 1D. In this case, the first diffusion layer area 2 having the higher impurity concentration constitutes the source area, and the second diffusion layer area 3 having the lower impurity concentration constitutes the drain area.

That is, according to the embodiment of the present invention, there can be obtained a transistor in which the impurity concentration is asymmetric between the source and the drain, and also the contacts to be connected to the wires provided for the source and the drain are different in size between the source side and the drain side.

More specifically, in the embodiment of the present invention, the semiconductor device is formed by the same method as the prior art until the step of FIG. 1A. However, in the subsequent step, the insulating film 13 is formed at a thickness of 5000 Å as shown in FIG. 1B.

Subsequently, the contact opening portions 14, 14' are formed at predetermined sites of the interlayer insulating film 13. In this step, the diameter of the opening portion 14 is set to 0.4 $\mu$m, for example, and the diameter of the opening portion 14' is set to 0.6 $\mu$m, for example.

Subsequently, a wiring layer 15 of 2000 Å thickness is formed and then subjected to a patterning treatment. At this time, due to the relationship between the contact diameter and the film thickness of the wire, the opening portion 14 in which the second contact wire 5 is formed is fully embedded with the wire 5, however, the space portion 11 is formed in the opening portion 14' in which the first contact wire 4 is formed because the opening portion 14' is not fully embedded with the wire 4.

Under this state, N-type impurities (for example, As) are doped again with the embedded wire being used as a mask by the ion implantation to form a diffusion layer 2 having a higher impurity concentration, thereby forming an asymmetrical transistor.

As a result, there can be obtained the asymmetrical transistor in which the contacts connected to the wires provided for the source and the drain are structurally different in size between the source side and the drain side.

In order to reduce the current density, a step of forming an enforcing wire 18 in the space portion 11 may be added.

Next, an embodiment of a method of manufacturing the semiconductor device 10 will be described with reference to FIGS. 1A to 1D. FIGS. 1A to 1D are cross-sectional views showing the main part of the semiconductor device manufacturing method according to the present invention.

According to the semiconductor device manufacturing method of this embodiment, as shown in FIGS. 1A to 1D, first impurities having a first conduction type (for example, As or the like) are doped at plural predetermined positions in the neighborhood of the surface of a substrate or semiconductor layer 1 to form plural second diffusion layer areas 3, 3'. Thereafter, contact wires are formed in the respective second diffusion layer areas so that the sectional area of the contact wire 4 formed in one second diffusion layer area 3' is set to be larger than that of the contact wire 5 formed in the other second diffusion layer area 3. At the same time, a space portion 11 is formed in the contact wire 4 having the larger sectional area, and by using the peripheral edge portion of the contact wire as a mask, the first impurities having the same conduction type as the first conduction type (that is, As) are further doped into the second diffusion layer area 3' through the space portion 11 to form a first diffusion layer area 2 having a higher impurity concentration than that of the second diffusion layer areas 3, 3'.

That is, as described above, according to this embodiment, the diffusion layer areas 3, 3' having the predetermined impurity concentration which are formed at the predetermined positions of the semiconductor substrate 1 are referred to as "second diffusion layers", and the diffusion layer area which is formed by further doping a part (the diffusion layer area 3') of the diffusion layer areas 3, 3' having the predetermined impurity concentration with the same impurities so that the impurity concentration of the diffusion layer area 3' concerned is higher than the impurity concentration of the other diffusion layer area 3 is referred to as "first diffusion layer area 2".

More specifically, the semiconductor device manufacturing method of the present invention comprises a step of doping first impurities having a first conduction type at plural predetermined positions in the neighborhood of the surface of a substrate or semiconductor layer to form plural second diffusion layer areas, a step of forming an interlayer insulating film on the surface of the substrate or semiconductor layer, a step of performing a patterning treatment on the interlayer insulating film so that the sectional area of the opening portion of the interlayer insulating film corresponding to one second diffusion layer area is larger than the sectional area of the opening portion of the interlayer insulating film corresponding to the other second diffusion layer area, a step of forming a conductive member from the upper side of the interlayer insulating film and performing a predetermined patterning treatment, and forming a space portion extending along the longitudinal axial direction of the contact wire at least in the contact wire formed at the opening portion of the interlayer insulating film having the larger sectional area, and a step of supplying first impurities having the same conduction type as the first conduction type of the first impurities into the one second diffusion layer area, and further doping the first impurities into the one second diffusion layer area through the bottom portion of the space portion with the peripheral edge portion of the contact wire having the space portion formed therein being used as a mask, thereby forming the first diffusion layer area having the higher impurity concentration than the impurity concentration of the other second diffusion layer area.

The first diffusion layer area 2 according to the present invention is formed to be in self-alignment with the contact wire 4 in which the space portion 11 is formed.

In the semiconductor device manufacturing method of the present invention, the space portion 11 formed in the contact wire 4 may be embedded with the same or different conductive member in the subsequent step.

Further, in the semiconductor device manufacturing method of the present invention, at least one of the space portion 11 and the first contact wire 4 is preferably designed to be increased in sectional area along the axial direction of the space portion 11 or first contact wire 4 as it is far away from the contact portion with the first diffusion layer area. As described above, according to the embodiment of the present invention, the transistor can be constructed by using the first diffusion layer area and the second diffusion layer area. In this case, it is preferable that the first diffusion layer area constitutes the source area, and the second diffusion layer area constitutes the drain area.

Next, another embodiment of the present invention will be described in detail with reference to FIGS. 4A to 4C and 5A to 5B.

In the above embodiment, paying much attention to the relationship between one diffusion layer area and the other diffusion layer area located in the neighborhood of the former diffusion layer area, these neighboring diffusion layer areas are designed to be different in impurity concentration from each other, and particularly a transistor is constructed under this condition. However, the embodiment described hereunder does not necessarily aim to form a transistor, and in consideration of the arrangement of all the elements in a semiconductor device, this embodiment aims to implement a technique of easily enabling the electrical characteristic of a diffusion layer area at a desired site to be different from the electrical characteristic of a diffusion layer area at another site.

Figure 5A:
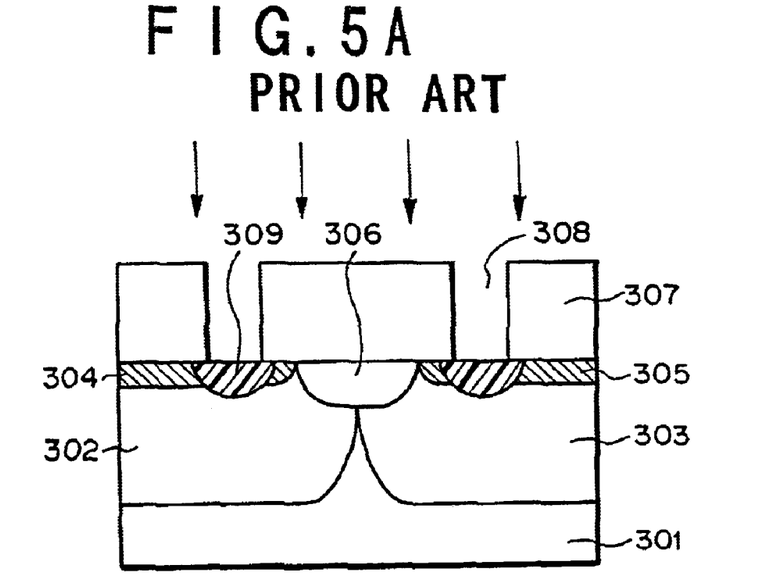
FIGS. 5A and 5B show a conventional semiconductor device manufacturing method.

For example, in the prior art, as shown in FIG. 5A, a p-well 302 and an n-well 303 are formed on the surface of a p-type silicon substrate 301, an $n^+$ diffusion layer 304, a $p^+$ diffusion layer 305 and an element separation layer 306 are formed on the surface thereof, and then an insulating film 307 is formed. Thereafter, a contact hole 308 is formed and then n-type impurities of about $1\times10^{14}$ cm$^{-2}$ are doped to the whole surface to form an n-type layer 309 below the contact hole.

Figure 5B:
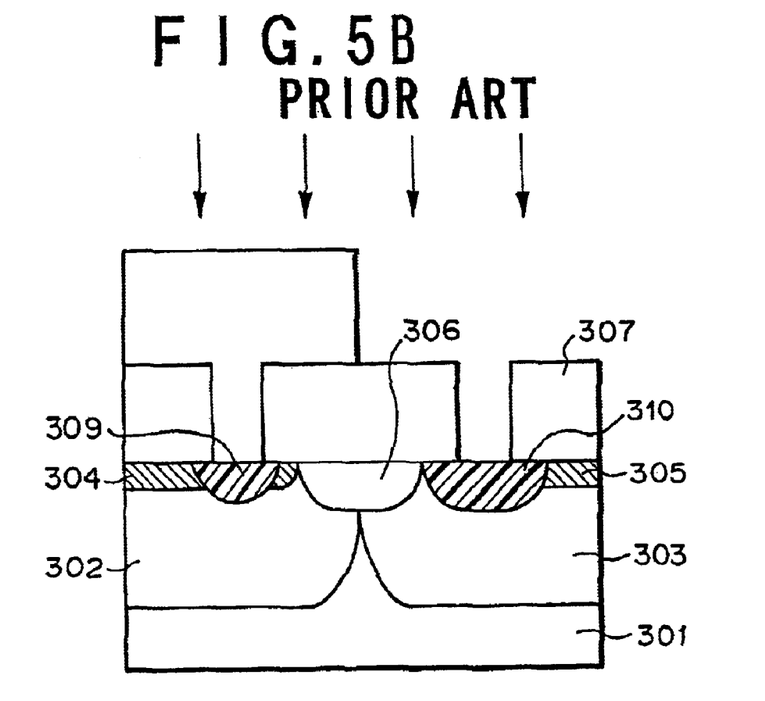

Subsequently, as shown in FIG. 5B, the contact opening portion on the $n^+$ area 304 is masked with resist by using the lithography technique, and p-type impurities of about $1\times10^{15}$ cm$^{-2}$ are additionally doped to renovate the n-type layer 309 into a p-type layer 310.

Subsequently, the wire forming step is carried out, and the contact structure between CMOS and wires is completed (not shown).

In the prior art, the lithographic step is additionally required in order to form the contact structure between CMOS and the wires, and thus the number of steps is increased, so that the manufacturing cost is increased.

Accordingly, in the prior art, the electrical characteristics of the first diffusion layer area and the second diffusion layer area can be set to be different from each other, and it is not necessarily required that the impurity concentration of one diffusion layer area is different from that of the other diffusion layer. However, in consideration of the renovation work as described above, the impurity concentration of the first diffusion layer area is necessarily larger than the impurity concentration of the second diffusion layer area.

Figure 4A:
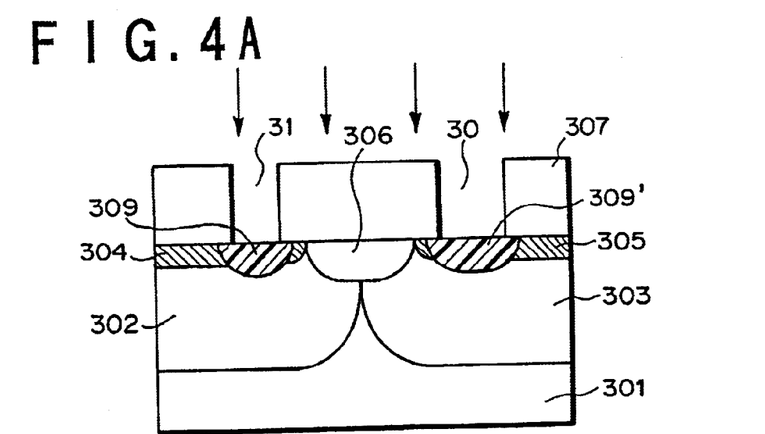
FIGS. 4A, 4B, and 4C show successive steps in another manufacturing process in the semiconductor device manufacturing method according to the present invention.
Figure 4B:
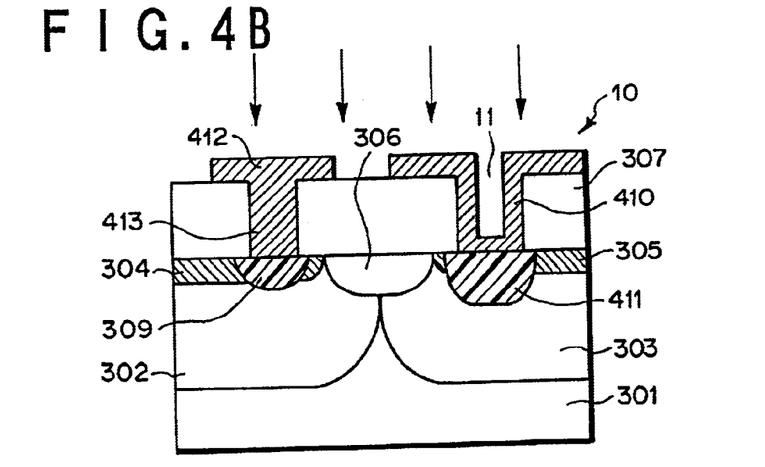
Figure 4C:
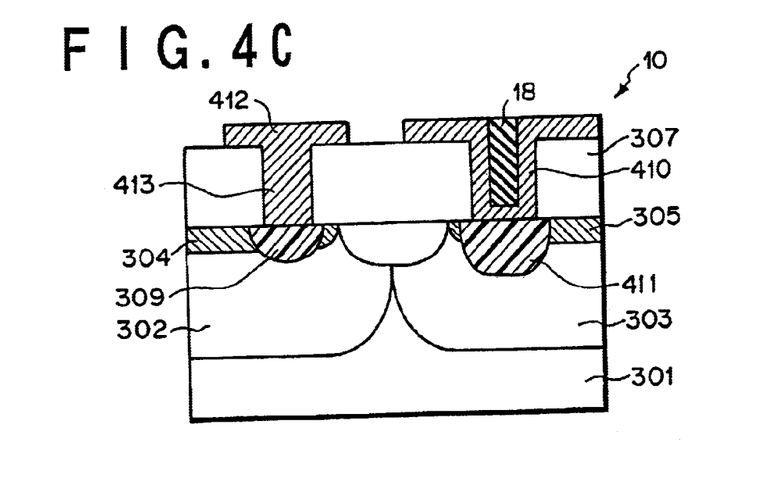

In the embodiment of the present invention, as shown in FIGS. 4A to 4C, impurities having a predetermined electrically conductive property, for example, p-type impurities are doped to form diffusion layer areas 309, 309' having a lower impurity concentration and a first conduction type, and a large amount of impurities (for example, n-type impurities) having the opposite electrically conductive property to the impurities having the predetermined electrically conductive property are doped into a part or the whole of the diffusion layer area 309' having the first conduction type to renovate a part or the whole of the diffusion layer area 309' into a diffusion layer area 411 having a conduction type different from the first conduction type, thereby forming a semiconductor device 10.

As shown in FIG. 4B, a space portion 11 is preferably formed in the first contact wire 410 so as to extend along the longitudinal axial direction of the contact wire.

Further, in this embodiment, the diffusion layer area 411 having the higher impurity concentration is preferably formed with the impurities doped through the space portion 11 provided in the first contact wire 410 and thus designed to be self-alignment with the first contact wire 410.

Still further, the space portion 11 in the first contact wire 410 is preferably embedded with the same or different conductive member 18 as shown in FIG. 4C.

In this embodiment, at least one of the space portion 11 and the first contact wire 410 may be designed to be increased in sectional area along the axial direction of the space portion 11 or first contact wire 410 as it is far away from the contact portion with the diffusion layer area 411 having the higher impurity concentration.

The semiconductor device and the manufacturing method thereof according to this embodiment will be described in more detail.

FIG. 4A shows a step of forming the contact hole in the interlayer insulating film 307 which is formed by using the same method as described with reference to FIG. 5A (prior art). The diameter of the contact hole 30 of an n-type diffusion layer 309' is set to 0.6 µm, for example, and the diameter of the contact hole 31 of an n-type diffusion layer 309 is set to 0.4 µm, for example. That is, the contact holes 30 and 31 are designed to be different in size.

Subsequently, a wire layer 412 of 2000 Å in thickness is formed and then subjected to the patterning treatment. At this time, due to the relationship between the diameter of the contact holes 30, 31 and the film thickness of the wire layer, the smaller contact hole 31 is perfectly embedded with the wirelayer, however, the larger contact hole 30 is not perfectly embedded with the wire layer, so that it is designed as if the space portion 11 is formed in the contact wire 410.

Under this state, p-type impurities of about $1 \times 10^{15}$ cm$^{-2}$ are doped to renovate the n-type diffusion layer 309' to a p-type diffusion layer area 411 as shown in FIG. 4B.

As a result, the conduction type of the diffusion layer (n-type, p-type) is varied in accordance with the size of the contact, and the wire layer is designed at the contact so that the contact wire 413 is perfectly embedded at the diffusion layer area 309 having the lower impurity concentration and the contact wire 410 is not perfectly embedded at the diffusion layer area 411 having the higher impurity concentration.

The p-type impurities are doped into the diffusion layer area 309' through the space portion 11 of the contact wire 410 by the ion implantation.

In order to reduce the current density, a step of forming an enforcing wire 18 in the space portion 11 may be added.

This embodiment is characterized in that the type of the diffusion layer (n-type, p-type) is varied in accordance with the size of the contact wire connected to the diffusion layer formed on the semiconductor substrate, and the contact hole is perfectly embedded in the smaller contact wire, but it is not perfectly embedded in the larger contact wire.

Next, the method of manufacturing the semiconductor device according to this embodiment will be described.

According to the semiconductor device manufacturing method of this embodiment, first impurities having a first conduction type (for example, As) are doped at plural predetermined positions in the neighborhood of the surface of a substrate or semiconductor layer to form plural second diffusion layer areas 309, 309', and then contact wires are formed in the second diffusion layer areas so that the sectional area of the contact wire 410 formed on one second diffusion layer area 309' is larger than that of the contact wire formed in the other second diffusion layer area 309. At the same time, a space portion 11 is formed in the contact wire 410 having the larger sectional area, and second impurities (for example, B: boron or the like) having a second conduction type different from the first conduction type of the first impurities are doped into the second diffusion layer area 309' through the space portion 11 with the peripheral edge portion or lateral wall portion of the contact wire 410 being used as a mask so that the impurity concentration of the second impurities is higher than that of the first impurities to renovate the conductive characteristic of the second diffusion layer area and form a first diffusion layer area having the second conduction type.

The process of the semiconductor device manufacturing method according to this embodiment comprises: a step of doping first impurities having a first conduction type, for example As, at plural predetermined positions in the neighborhood of the surface of a substrate 301 or semiconductor wells 302, 303 to form plural second diffusion layer areas 309, 309'; a step of forming an interlayer insulating film 307 on the surface of the substrate 301 or the semiconductor wells 302, 303; a step of performing a patterning treatment on the interlayer insulating film 307 so that the sectional area of the opening portion 30 of the interlayer insulating film 307 corresponding to one second diffusion layer area 309' is larger than the sectional area of the opening portion 31 of the interlayer insulating film 370 corresponding to the other second diffusion layer area 309; a step of forming a contact wire layer of a suitable conductive member from the upper side of the interlayer insulating film 307 and performing a predetermined patterning treatment to form a space portion 11 in the contact wire 410 formed at least in the opening portion 30 having the larger sectional area so as to extend along the longitudinal axial direction of the contact wire; and a step of doping second impurities having a second conduction type (for example, boron) different from the first conduction type of the first impurities in the second diffusion layer areas 309, 309' from the upper side of the interlayer insulating film 307 and the contact wire 410 into the second diffusion layer area 309' through the bottom portion of the space portion 11 with the peripheral edge of the contact wire 410 having the space portion 11 therein being used as a mask so that the impurity concentration of the second impurities is higher than the impurity concentration of the first impurities in the second diffusion layer area 309', thereby renovating the conductive characteristic of the second diffusion layer area 309' and forming a first diffusion layer area 411 having the second conduction type.

In this embodiment, the first diffusion layer area 411 is preferably formed in self-alignment with the contact wire 410 in which the space portion 11 is formed, and the space portion 11 in the contact wire 410 is preferably embedded with the same or different conductive member 18 in a subsequent step.

In this embodiment, at least one of the space portion 11 and the first contact wire 410 is designed to be increased in sectional area along the axial direction of the space portion or the first contact wire as it is far away from the contact portion with the first diffusion layer area.

As described above, according to the semiconductor device and the semiconductor device manufacturing method of the present invention, the contact of MOS transistor such as CMOS transistor can be formed by controlling the coverage of the wire layer at the contact portion and performing the additional ion implantation using the contact wire as a mask. Therefore, when a semiconductor device is manufactured so that the impurity concentration in a part of the diffusion layer area is set to be different from that of the other diffusion layer area and the size of the contact wire is varied between these areas, no additional lithographic step is needed, and the increase of the manufacturing cost can be reduced.

According to the present invention, the asymmetrical transistor can be formed by controlling the coverage of the wire layer at the contact portion and performing the additional ion implantation using the contact wire as a mask without additional lithographic step, and the increase of the manufacturing cost can be reduced.

What is claimed is:

1. A method of manufacturing a semiconductor device comprising the steps of:

doping first impurities having a first conduction type into plural predetermined positions in the neighborhood of the surface of a semiconductor substrate or a semiconductor layer to form plural second diffusion layer areas;

forming contact wires on the second diffusion layer areas so that a contact wire formed in at least one of the second diffusion layer areas is set to be larger in sectional area than a contact wire formed in the other of the second diffusion layer areas;

forming a space portion in the contact wire having the larger sectional area; and further doping first impurities having the same conduction type as the first conduction type into the at least one of the second diffusion layer areas through the space portion with the peripheral edge portion of the contact wire being used as a mask to form a first diffusion layer area having an impurity concentration higher than the impurity concentration of the other of the second diffusion layer areas.

2. The semiconductor device manufacturing method as claimed in claim 1, wherein the first diffusion layer area is formed in self-alignment with the contact wire in which the space portion is formed.

3. The semiconductor device manufacturing method as claimed in claim 1, wherein the space portion is embedded with a conductive member in a subsequent step.

4. The semiconductor device manufacturing method as claimed in claim 1, wherein at least one of said space portion and said contact wire having the space portion therein is formed so as to be increased in a sectional area along the axial direction of the space portion or the contact wire with being far away from a contact portion with the first diffusion layer.

5. The semiconductor device manufacturing method as claimed in claim 1, wherein a transistor is constructed by the first diffusion layer area and the other of the second diffusion layer areas.

6. The semiconductor device manufacturing method as claimed in claim 5, wherein said first diffusion layer area constitutes a source region of the transistor, and said other of the second diffusion layer areas constitutes a drain region of the transistor.

7. A method of manufacturing a semiconductor device comprising the steps of:

doping first impurities having a first conduction type into plural predetermined positions in the neighborhood of the surface of a semiconductor substrate or a semiconductor layer to form plural second diffusion layer areas;

forming contact wires on the second diffusion layer areas so that a contact wire formed in at least one of the second diffusion layer areas is set to be larger in sectional area than a contact wire formed in the other of the second diffusion layer areas;

forming a space portion in the contact wire having the larger sectional area; and doping second impurities having a second conduction type different from the first conduction type of the first impurities into the at least one of the second diffusion layer areas through the space portion with the peripheral edge portion of the contact wire being used as a mask so that the concentration of the second impurities is higher than that of the first impurities in the at least one of the second diffusion layer areas, whereby the conductive characteristics of the at least one of the second diffusion layer areas is renovated to form a first diffusion layer area having the second conduction type.

8. A method of manufacturing a semiconductor device comprising the steps of:

doping first impurities having a first conduction type into plural predetermined positions in the neighborhood of the surface of a semiconductor substrate or a semiconductor layer to form plural second diffusion layer areas;

forming an interlayer insulating film on the surface of the semiconductor substrate or the semiconductor layer;

performing a patterning treatment of the interlayer insulating film so that an opening portion of the interlayer insulating film corresponding to at least one of the second diffusion layer areas is set to be larger in sectional area than an opening portion of the interlayer insulating film corresponding to the other of the second diffusion layer areas;

forming a conductive layer on the interlayer insulating film to form contact wire in each of the opening portions so that a space portion is formed in the contact wire formed in the opening portion having the larger sectional area corresponding to the at least one of the second diffusion layer areas so as to extend the longitudinal axial direction of the contact wire, and performing a predetermined patterning treatment of the conductive layer on the interlayer insulating film; and further doping first impurities having the same conduction type as the first conduction type from the upper side of the interlayer insulating film and the contact wire into the at least one of the second diffusion layer areas through the bottom portion of the space portion with the peripheral edge portion of the contract wire being used as a mask to form a first diffusion layer area having an impurity concentration which higher than the impurity concentration of the other of the second diffusion layer.

9. A method of manufacturing a semiconductor device comprising the steps of:

doping first impurities having a first conduction type into plural predetermined positions in the neighborhood of the surface of a semiconductor substrate or a semiconductor layer to form plural second diffusion layer areas;

forming an interlayer insulating film on the surface of the semiconductor substrate or the semiconductor layer;

performing a patterning treatment of the interlayer insulating film so that an opening portion of the interlayer insulating film corresponding to at least one of the second diffusion layer areas is set to be larger in sectional areas than an opening portion of the interlayer insulating film corresponding to the other of the second diffusion layer areas;

forming a conductive layer on the interlayer insulating film to form contact wire in each of the opening portions so that a space portion is formed in the contact wire formed in the opening portion having the larger sectional area corresponding to the at least one of the second diffusion layer areas so as to extend the longitudinal axial direction of the contact wire, and performing a predetermined patterning treatment of the conductive layer on the interlayer insulating film; and doping second impurities having a second conduction type different from the first conduction type of the first impurities from the upper side of the interlayer insulating film and the contact wire into the at least one of the second diffusion layer areas through the bottom portion of the space portion with the peripheral edge portion of the contact wire being used as a mask so that the concentration of the second impurities is higher than that of the first impurities in the at least one of the second diffusion layer areas, whereby the conductive characteristic of the at least one of the second diffusion layer areas is renovated to form a first diffusion layer area having the second conduction type.

* * * * *